US007412358B2

(12) United States Patent
Bochobza-Degani et al.

(10) Patent No.: US 7,412,358 B2
(45) Date of Patent: Aug. 12, 2008

(54) EFFICIENT METHOD OF EXTRACTING THE PULL-IN PARAMETERS OF AN ELECTROSTATICALLY ACTIVATED MEMS DEVICE FOR THE PURPOSE OF DESIGNING THE DEVICE

(75) Inventors: Ofir Bochobza-Degani, Ashkelon (IL); David Elata, Haifa (IL); Yael Nemirovsky, Haifa (IL); Eran Socher, Tel Aviv (IL)

(73) Assignee: Technion Research and Development Foundation Ltd., Haifa (IL)

( * ) Notice: Subject to any disclaimer, the term of this patent is extended or adjusted under 35 U.S.C. 154(b) by 932 days.

(21) Appl. No.: 10/160,404

(22) Filed: Jun. 4, 2002

(65) Prior Publication Data

US 2003/0028360 A1 Feb. 6, 2003

(51) Int. Cl.
 *G06F 17/11* (2006.01)
 *G06F 19/00* (2006.01)
(52) U.S. Cl. ............................................. 703/2; 700/97
(58) Field of Classification Search ...................... 703/2, 703/13; 700/97
 See application file for complete search history.

(56) References Cited

U.S. PATENT DOCUMENTS 5,061,049 A   10/1991   Hornbeck

OTHER PUBLICATIONS

Gilbert et al, 3D Coupled Electro-mechanics for MEMS: Applications of CoSolve-EM, IEEE, 1995, pp. 122-127.*
Peter M. Osterberg and Stephen D. Senturia, "M-TEST: a test chip for MEMS material property measurement using electrostatically actuated test structures". Journal of Microelectromechanical Systems vol. 6 No. 2 pp. 107-117, Jun. 1997.*
C. T. C. Nguen et al., "Micromachined devices for wireless communications", *Proc. IEEE* vol. 86 No. 8 pp. 1756-1768 (Aug. 1998).
D. L. Dickensheets and R. G. Kino, "Silicon-micromachined scanning confocal optical microscope", *JMEMS* vol. 7 No. 1 pp. 38-47 (Mar. 1998).
P. Osterberg et al., "Self-consistent simulation and modeling of electrostatically deformed diaphragm", *Proc. IEEE MEMS* 94, Oiso, pp. 28-32 (Jan. 1994).
S. D. Senturia, "CAD challenges for microsensors, microactuators and Microsystems", *Proc. IEEE* vol. 86 No. 8 pp. 1611-1626 (1998).
Y. Nemirovsky and O. Degani, "A methodology and model for the pull-in parameters of electrostatic actuators", *JMEMS* vol. 10 No. 4 pp. 601-605 (Dec. 2001).

(Continued)

*Primary Examiner*—Paul L Rodriguez
*Assistant Examiner*—Luke Osborne
(74) *Attorney, Agent, or Firm*—Mark M. Friedman, Ltd.

(57) ABSTRACT

A method of efficiently extracting the pull-in parameters of an electrostatically activated actuator. The actuator is modeled as an elastic element. For each of a plurality of deformations of the elastic element, a corresponding voltage is calculated. The highest such voltage is the pull-in voltage of the actuator. The corresponding deformation is the pull-in deformation of the actuator. Each deformation is defined by fixing a displacement of one degree of freedom of the elastic body and calculating corresponding equilibrium displacements of all the other degrees of freedom without the application of any external mechanical forces to ensure equilibrium. The actuator is altered to optimize whichever pull-in parameter is relevant to the desired application of the actuator.

10 Claims, 11 Drawing Sheets

OTHER PUBLICATIONS

E. K. Chan et al., "Characterization of contact electromechanics through capacitance-voltage measurements and simulations", JMEMS vol. 8 No. 2 pp. 208-217 (Jun. 1999).

R. K. Gupta, Electrostatic Pull-In Test Structure Design for In-Situ Mechanical Property Measurements of Microelcetromechanical Systems (MEMS), PhD Thesis, Massachusetts Institute of Technology, Jun. 1997.

Osterberg et al., and also M. Fischer et al., electrostatically deflectable polysilicon micromirrors—dynamic behaviour and comparison with results from FEM modeling with ANSYS, Sensors and Actuators A vol. 67 pp. 89-95 (1998).

P. M. Osterberg, Electrostatically Actuated Microelectromechanical Test Structures for Material Property Measurements, PhD Thesis, Massachusetts Institiute of Technology, Sep. 1995).

G. D. Smith, Numerical Solution of Partial Differential Equations: Finite Difference Methods, Clarendon.Press, Oxford, 3rd Edition 1993.

E. S. Hung and S. D. Senturia in "Extending the travel range of analog-tuned electrostatic actuators", JMEMS vol. 8 No. 4 pp. 497-505 (Dec. 1999).

Gilbert et al: "3d Modeling Of Contact Problems And Hysteresis In Coupled Electro-Mechanics".

Senturia et al "A Computer-Aided Design System for Microelectromechanical Systems (MEMCAD)" 1992 IEEE Journal of Microelectromechanical Systems vol. 1, No. 1, Mar. 1992.

Gilbert et al; "Implementation of a memcad system for electostatic and mechanical analysis of complex structures form mask descriptions" 1993 IEEE.

Cai et al; "relaxation / Multipole—Accelerated Scheme for Self-Consistent Electromechanical Analysis of Complex 3-d Microelectromechanical Structures" 1993 IEEE.

Gilbert et al; "3D Coupled Electro-mechanics for MEMS: Application Of Cosolve-EM" 1995 IEEE.

Aluru et al; "Algorithms for coupled domain MEMS Simulation" Research Lab. OF Electronics MIT Cambridge, MA 02139.

* cited by examiner

EFFICIENT METHOD OF EXTRACTING THE PULL-IN PARAMETERS OF AN ELECTROSTATICALLY ACTIVATED MEMS DEVICE FOR THE PURPOSE OF DESIGNING THE DEVICE

FIELD AND BACKGROUND OF THE INVENTION

The present invention relates to Microelectromechanical (MEMS) devices and, more particularly, to an efficient method for extracting the pull-in instability parameters of electrostatically actuated MEMS devices.

Electrostatic actuation is widely used in MEMS devices to deform elastic elements. The electromechanical response of these actuators may exhibit an inherent instability, shown as the pull-in phenomenon. A voltage difference is applied across the electrodes of an actuator to generate an electrostatic force that tends to reduce the gap between the electrodes. For a sufficiently low voltage, the electrostatic force is balanced by an elastic restoring force. In this stable state the gap between the electrodes is inversely proportional to the applied voltage. Above a certain voltage, the electrostatic force is larger than the restoring elastic force for any deformation. As a result, the actuator is unstable and the gap between the two electrodes rapidly vanishes. The voltage and deformation at the onset of instability are termed pull-in voltage and pull-in deformation, or in short the pull-in parameters of the actuator.

Characterization of the pull-in parameters is important when designing electrostatically actuated micromachined devices. In switching applications, either optical (Hornbeck, U.S. Pat. No. 5,061,049) or electrical (C. T. C. Nguen et al., "Micromachined devices for wireless communications", *Proc. IEEE* vol. 86 no. 8 pp. 1756-1768 (August 1998)), the pull-in voltage is minimized to obtain optimal performance. In analog scanning micromirror applications (D. L. Dickensheets and R. G. Kino, "Silicon-micromachined scanning confocal optical microscope", *JMEMS* vol. 7 no. 1 pp. 38-47 (March 1998)), the travel range of the actuator is important and therefore the pull-in deformation should be maximized. Modeling tools that can simulate the nonlinear electromechanical response and extract the pull-in parameters of electrostatic actuators are therefore of great importance. To enable an accurate determination of optimal material and geometrical parameters of actuators, these modeling tools should be based on accurate and efficient calculations.

Several approaches for extracting the pull-in parameters have been reported in the technical literature (P. Osterberg et al., "Self-consistent simulation and modeling of electrostatically deformed diaphragm", *Proc. IEEE MEMS* 94, Oiso, pp. 28-32 (January 1994); S. D. Senturia, "CAD challenges for microsensors, microactuators and Microsystems", *Proc. IEEE* vol. 86 no. 8 pp. 1611-1626 (1998)) and have been implemented in MEMS CAD tools that are available commercially, for example from Coventor, Inc. of Cary N.C. USA and from Corning Intellisense of Wilmington Mass. USA. Approximate analytical models have been suggested for electrostatic actuators (Y. Nemirovsky and O. Degani, "A methodology and model for the pull-in parameters of electrostatic actuators", *JMEMS* vol. 10 no. 4 pp. 601-605 (December 2001): also see S. D. Senturia, *Microsystem Design*, Kluwer Academic Press, Boston, 2001). These models yield fast results but are limited to actuators with very few degrees of freedom. To accurately calculate the pull-in parameters of general deformable elements, such as beam and plate actuators, that have (in the continuum limit) an infinite number of degrees of freedom, a more general approach has been suggested (E. K. Chan et al., "Characterization of contact electromechanics through capacitance-voltage measurements and simulations", *JMEMS* vol. 8 no. 2 pp. 208-217 (June 1999); R. K. Gupta, *Electrostatic Pull-In Test Structure Design for In-Situ Mechanical Property Measurements of Microelectromechanical Systems (MEMS)*, PhD Thesis, Massachusetts Institute of Technology, June 1997). In this approach, which is referred to herein as the voltage-iteration (VI) method, the electromechanical response of the actuator is numerically simulated by fixing the applied voltage. The pull-in parameters are calculated by iteratively approaching the pull-in voltage with decreasing voltage increments. This algorithm has been implemented in a finite-difference scheme and in coupled finite-elements (FEM) and boundary-elements (BEM) scheme. See Osterberg et al., and also M. Fischer et al., "electrostatically deflectable polysilicon micromirrors—dynamic behaviour and comparison with results from FEM modeling with ANSYS, *Sensors and Actuators A* vol. 67 pp. 89-95 (1998).

A typical static equilibrium curve of an electrostatic actuator is schematically depicted in FIG. 1. The convex function describes the applied voltage as function of a representative parameter of the actuator deformation, for example, the displacement of the center of a clamped-clamped beam. For deformations smaller than the pull-in deformation, the static equilibrium state is stable (solid line). In contrast, for deformations larger than the pull-in deformation the static equilibrium state is unstable (dashed line).

Two aspects of the physical response of electrostatic actuators are apparent in FIG. 1. First, the voltage is a unique function of the deformation, whereas the deformation is not a unique function of the voltage. Second, the maximal deformation can be trivially estimated, as it is bounded from above by the gap between the electrodes. In contrast, the maximal voltage cannot be estimated a priori.

In the VI algorithm, the pull-in voltage is approached iteratively. At each iteration, the static equilibrium deformation is calculated for an applied voltage. This calculation can be carried out by a relaxation method, a Newton-Raphson method, or a host of other numerical schemes. If the deformation calculation converges, it is concluded that the applied voltage is below the pull-in value. On the other hand, if the calculated deformation fails to converge it is concluded that the applied voltage is higher than the pull-in value. Several methods have been employed in the references cited above to establish whether the deformation calculation converges. The interval between these two limits is continuously decreased until the voltage interval is smaller than a predetermined accuracy. The iterations are represented by the set of horizontal dashed lines in FIG. 1. It can easily be seen that not all the horizontal lines cross the equilibrium curve, and therefore not all lines are associated with equilibrium states.

FIG. 2 is a flow chart of the VI algorithm. In block 102, an initial trial value of an applied voltage V is selected. In block 104, an attempt is made to calculate the deformation corresponding to the present value of V. If the deformation calculation does not converge (block 106), then V is decreased (block 108) and the deformation calculation is attempted again in block 104. If the deformation calculation does converge (block 106), and V is less than its previously established upper bound by less than a predetermined accuracy (block 110) then the present value of V is taken as an estimate of the pull-in voltage (block 114). Otherwise, V is increased (block 112) and the deformation calculation is attempted again in block 104.

The main advantage of the VI algorithm is its simplicity and ease of integration into commercial CAD tools. For any applied voltage, the electro-elastic problem is solved by iteratively solving uncoupled electrostatic and elastic problems. It is therefore easy to implement this algorithm by sequentially employing existing numerical codes for each of these problems.

SUMMARY OF THE INVENTION

According to the present invention there is provided a method of calculating a pull-in voltage and a pull-in deformation of an elastic element of an elastically supported device, the elastic element having a plurality of degrees of freedom, the method including the steps of: (a) for each of a plurality of deformations of the elastic element, calculating a corresponding voltage; and (b) selecting a maximum corresponding voltage as the pull-in voltage, a corresponding the deformation then being the pull-in deformation.

According to the present invention there is provided a method of designing an electromechanical actuator, including the steps of: (a) modeling the actuator as an elastic element having a plurality of degrees of freedom; and (b) for each of a plurality of deformations of the elastic element: (i) specifying the each deformation by postulating a fixed displacement of one of the degrees of freedom, (ii) calculating corresponding displacements of all other degrees of freedom, and (iii) calculating an applied voltage that corresponds to the displacements; a largest applied voltage then being a pull-in voltage of the actuator, and the deformation that corresponds to the largest applied voltage then being a pull-in deformation of the actuator.

According to the present invention there is provided a computer-readable medium for assisting in designing an electromechanical actuator, having stored thereon instructions which, when executed by a processor, cause the processor: (a) to model the actuator as an elastic element having a plurality of degrees of freedom; and (b) for each of a plurality of deformations of the elastic element: (i) to specify the each deformation by postulating a fixed displacement of one of the degrees of freedom: (ii) to calculate corresponding displacements of all other degrees of freedom, and (iii) to calculate an applied voltage that corresponds to the displacements; a largest applied voltage then being a pull-in voltage of the actuator, and the deformation that corresponds to the largest applied voltage then being a pull-in deformation of the actuator.

The present invention is a method of calculating a pull-in voltage and a pull-in deformation of an elastic element, by systematically considering a plurality of deformations of the elastic element. For each deformation, a corresponding voltage is calculated. The largest voltage obtained in this manner is taken to be the pull-in voltage.

Preferably, to obtain each deformation, one particular degree of freedom of the elastic element is chosen to control the calculation of that deformation. A displacement of that degree of freedom is fixed at a certain postulated value, and the corresponding equilibrium displacements of the other degrees of freedom of the elastic element, without external mechanical forces to ensure equilibrium, are calculated. The corresponding voltage is calculated as the applied voltage that results in that deformation. Preferably, the same degree of freedom is used to control all the calculations.

Preferably, the degrees of freedom that are used to control the calculations of the deformations are degrees of freedom on which the electrostatic energy of the elastic element depends. Preferably, the corresponding displacements of the other degrees of freedom, as well as the applied voltage that results in those displacements, are calculated by solving a set of equilibrium equations that are defined by requiring, for each degree of freedom, the vanishing of a derivative, with respect to the degree of freedom, of a total co-energy of the elastically supported device that includes the elastic element. These equations may be solved either by a relaxation scheme or by a gradient-based scheme.

A related aspect of the present invention is a method of designing an electromechanical actuator, for example a MEMS actuator. The actuator is modeled as an elastic element having a plurality of degrees of freedom. The pull-in voltage of the elastic element is computed as described above. The pull-in deformation of the elastic element is the deformation that corresponds to the pull-in voltage.

Preferably, the method of designing the actuator also includes altering the actuator to optimize either the pull-in voltage or the pull-in displacement. For example, an actuator that functions as a switch is altered to minimize the pull-in voltage, and an actuator that functions as a scanning micromirror is altered to maximize the pull-in displacement. The actuator may be altered by selecting a corresponding optimal material for the actuator, or by determining a corresponding optimal shape of the actuator, or both.

The scope of the present invention also includes a computer-readable medium on which instructions for implementing the method of the present invention are stored, as well as a MEMS CAD tool that includes such a computer-readable medium.

The present invention is based on an innovative algorithm for extracting the pull-in parameters of general electrostatic actuators. The algorithm iterates the displacement of a pre-chosen degree-of-freedom of the actuator, rather than the applied voltage. In essence, the algorithm of the present invention replaces the original problem that has stable and unstable equilibrium states, with a series of equivalent problems for which the equilibrium solution is always stable.

The present invention is based on the realization that an unstable equilibrium state of a voltage-controlled problem may be replaced by a stable equilibrium state of a displacement-controlled problem that is equivalent in the sense that both are the same equilibrium solution. To this end, consider an electrostatic actuator where a pre-chosen point is displaced and fixed at its new location. This gives rise to a mechanical reaction force at the pre-chosen point. Next, a voltage is applied to the actuator inducing electrostatic forces and modifying the reaction force. The voltage is then continuously modified until the reaction force at the pre-chosen point vanishes. Because the reaction force is zero, the voltage at the resulting state is the same voltage as would induce the same displacement in the original voltage controlled problem. However, while in the original voltage controlled problem this state may be unstable, in the displacement-controlled problem the state is stable because the pre-chosen point is fixed.

The algorithm of the present invention uses this inverse approach in which all calculations converge. At each iteration, the displacement of a pre-chosen degree of freedom of the actuator is postulated. A set of reduced (voltage-free) electro-plastic coupled equations is then solved to yield the deformation of the actuator while nullifying the reaction force applied to the pre-chosen degree of freedom. Next, the applied voltage that is required to induce the given defoliation is calculated. A simple local-maximum search is employed to iteratively approach the pull-in state where the voltage is maximal. The iterations are represented by the set of vertical dashed lines in FIG. 1. Each of these vertical lines crosses the equilibrium curve and is therefore associated with an equilibrium state of the actuator.

Like the prior art VI algorithm, the algorithm of the present invention can be easily integrated into commercial CAD tools, using separate electrostatic and mechanical field solvers.

Although the description herein is directed towards the calculation of the pull-in parameters of an electrostatic actuator, it will be appreciated by those skilled in the art that the principles of the present invention are also applicable to other types of actuators, for example magnetostatic actuators and piezoelectric actuators.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of calculating the pull-in parameters of an electrostatic actuator. Specifically, the present invention can be used to help design a MEMS actuator.

The principles and operation of MEMS actuator design according to the present invention may be better understood with reference to the drawings and the accompanying description.

Figure 3:
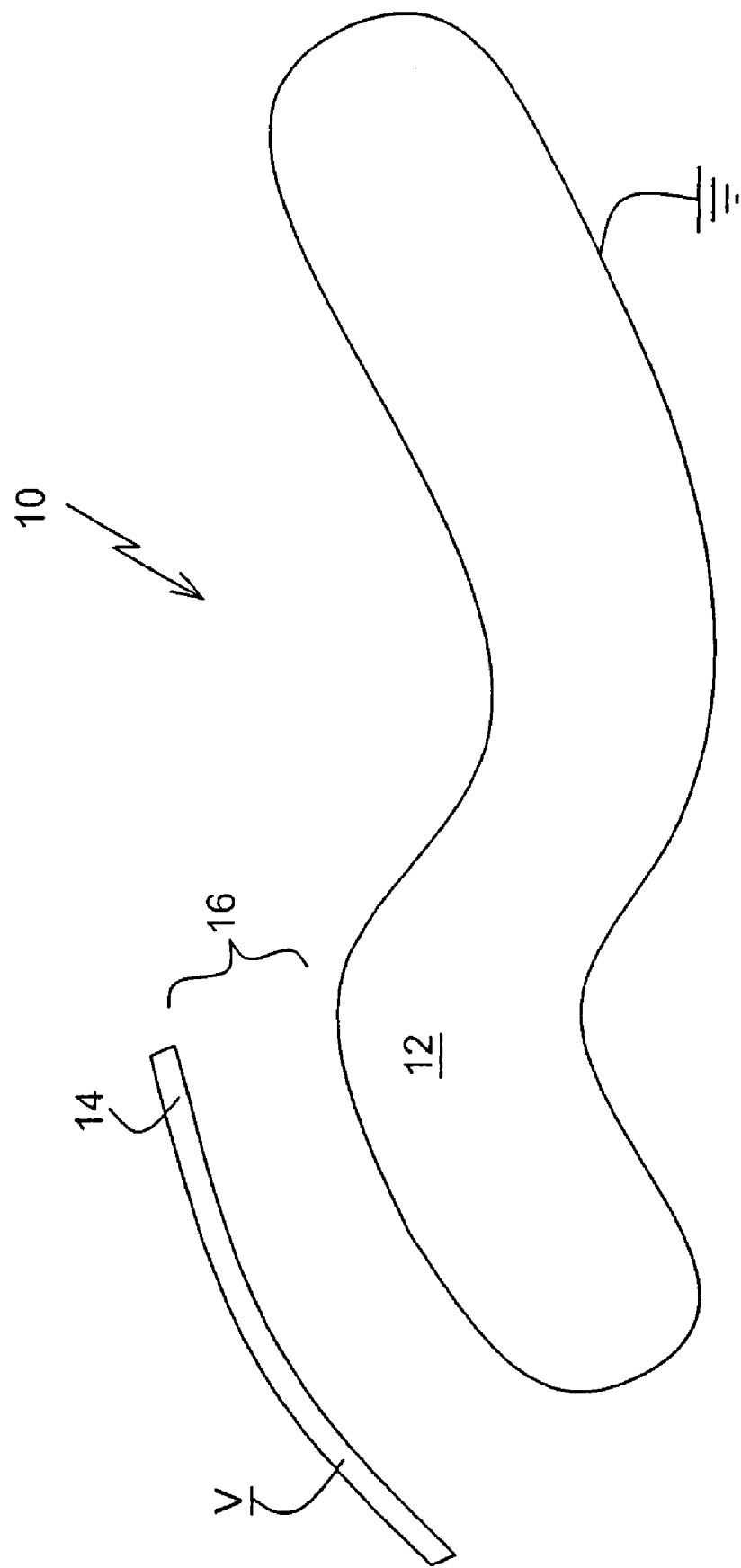
FIG. 3 illustrates a general electrostatic actuator.

Referring again to the drawings, FIG. 3 depicts, schematically, a general electrostatic actuator 10 formed from a grounded elastic conducting body 12 with a general shape and a counter electrode 14. The facing surfaces of electrode 14 and conducting body 12 form a free space capacitor 16 with a variable capacitance C and with a variable gap. An energy source applies a voltage difference V across the capacitor inducing an electrostatic force. In response, body 12 deforms: the mechanical strain energy of body 12 is increased, and generalized mechanical restoring forces develop. External forces such as gravity and external pressure may also apply. Capacitor 16 is assumed to be a linear electrical element, for which the charge Q is proportional to the voltage V, but the capacitance C may be a non-linear function of the deformation of body 12.

Body 12 is modeled numerically as having N generalized degrees of freedom, with corresponding displacement coordinates denoted by $q_1$ through $q_N$. Usually, these degrees of freedom are linear combinations of the coordinates of the nodes of the mesh that is used to discretize body 12. N must be large enough that the numerical results obtained are sufficiently close to the results that would be obtained in the continuum limit. Preferably, this discretization is iteratively refined to validate the desired convergence of the calculations towards the continuum limit. While the mechanical energy of actuator 10 depends on all N degrees of freedom, the electrostatic energy of actuator 10 may depend only on K of these degrees of freedom, where $K \leq N$. For example, the electrostatic force may depend only on the surface degrees of freedom. Without restricting the generality of the present formulation, it is assumed that the K degrees of freedom upon which the electrostatic energy of actuator 10 depends are the first K degrees of freedom. The total co-energy of the actuator, $U^*_T$, can be then written as a linear combination of the electrical co-energy and the mechanical energy $U_M$:

$$U^*_T(q_1, q_2, \ldots, q_N) = \frac{1}{2} C(q_1, q_2, \ldots, q_K) V^2 - U_M(q_1, q_2, \ldots, q_N) \quad (1)$$

where the first term on the right hand side of equation (1) is the electrical co-energy.

The equilibrium states of actuator 10 are those states for which the total co-energy has a local extremum. In these states of equilibrium, the derivatives of the total co-energy with respect to the degrees of freedom vanish, resulting in the following equilibrium equations:

$$F_M^j = \frac{\partial U_M}{\partial q_j} = \frac{1}{2} \frac{\partial C}{\partial q_j} V^2 = F_{E(V=1)}^j V^2 = F_E^j \quad j = 1 \ldots K \quad (2a)$$

$$F_M^j = \frac{\partial U_M}{\partial q_j} = 0 \quad j = (K+1) \ldots N \quad (2b)$$

The left hand sides of equations (2a) and (2b) denote the generalized mechanical force $F_M^j$ associated with the j-th degree of freedom. The right hand side of equation (2a) denotes the electrostatic force $F_E^j$ associated with the j-th degree of freedom. The electrostatic force associated with the j-th degree of freedom at unit voltage is denoted by $$F_{E(V=1)}^j = \frac{1}{2} \frac{\partial C}{\partial q_j}.$$

The applied voltage associated with the j-th degree of freedom is defined as follows:

$$V_i^2 = \frac{F_M^j}{F_{E(V=1)}^j} \quad (3)$$

The mean square of these applied voltages over the K electrostatic degrees of freedom therefore is:

$$\bar{V}^2 = \frac{1}{K}\sum_{n=1}^{k} V_j^2 = \frac{1}{K}\sum_{n=1}^{k} \frac{F_M^j}{F_{E(V=1)}^j} \quad (4)$$

The voltage in equation (2a) can be eliminated by substituting equation (4) into equation (2a), leading to the following reduced equations $$\frac{F_M^j}{F_{E(V=1)}^j} - \frac{1}{K}\sum_{n=1}^{k} \frac{F_M^n}{F_{E(V=1)}^n} = 0 \quad j = 1 \ldots K, j \neq 1 \quad (5a)$$

$$F_M^j = 0 \quad j = (K+1)\ldots N \quad (5b)$$

The resulting K equations (5a) are linearly dependent. As discussed below, one of them (denoted as the i-th equation) is eliminated, so that equations (5) are reduced to N−1 equations. As can be obviously seen from equations (5), two sets of vectors should be calculated: the generalized mechanical force associated with each degree of freedom and the electrostatic force associated with each electrostatic degree of freedom for a unit applied voltage.

Equations (5) are the basis of a displacement iterations algorithm. For a given deflection deviating from the solution deflection, the left hand side of equation (5a) can be interpreted as the voltage deviation at the j-th degree of freedom from the average voltage given by the mean square in equation (4). According to this interpretation, equation (5a) requires that all K of these deviations vanish.

Figure 1:
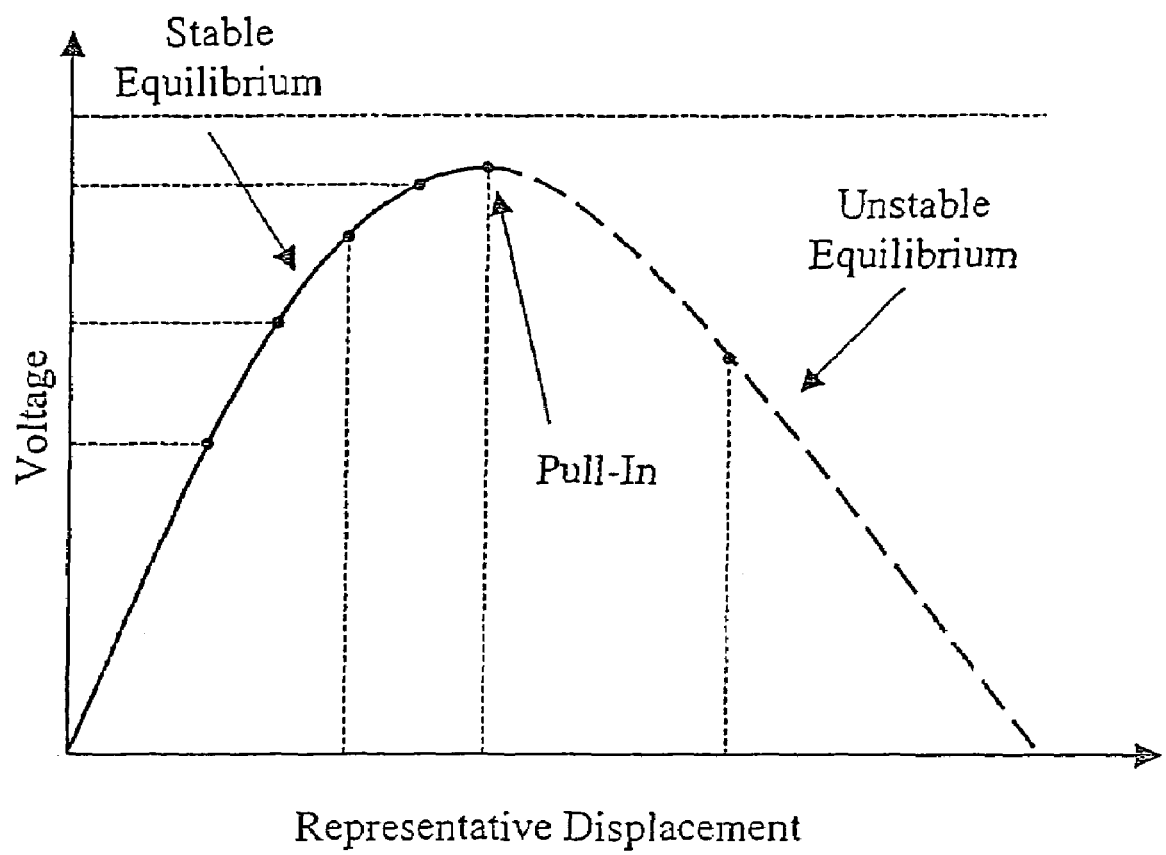
FIG. 1 shows, schematically, a static equilibrium curve of an electrostatic actuator.

If a physical solution of the original problem, stable or unstable, exists for a postulated deflection of one preselected degree of freedom, and a solver that reduces these deviations is employed, the solver necessarily converges to this physical solution. Moreover, the voltage mean square converges to the voltage required to achieve the postulated deflection of the preselected degree of freedom, while eliminating all reaction forces along the structure including the reaction at the preselected degree of freedom. Thus, while the original problem had stable equilibrium states and unstable equilibrium states, as shown in FIG. 1, in the displacement iteration scheme of the present invention, the original problem is replaced with a series of equivalent problems for which the equilibrium solution is always stable.

Figure 4:
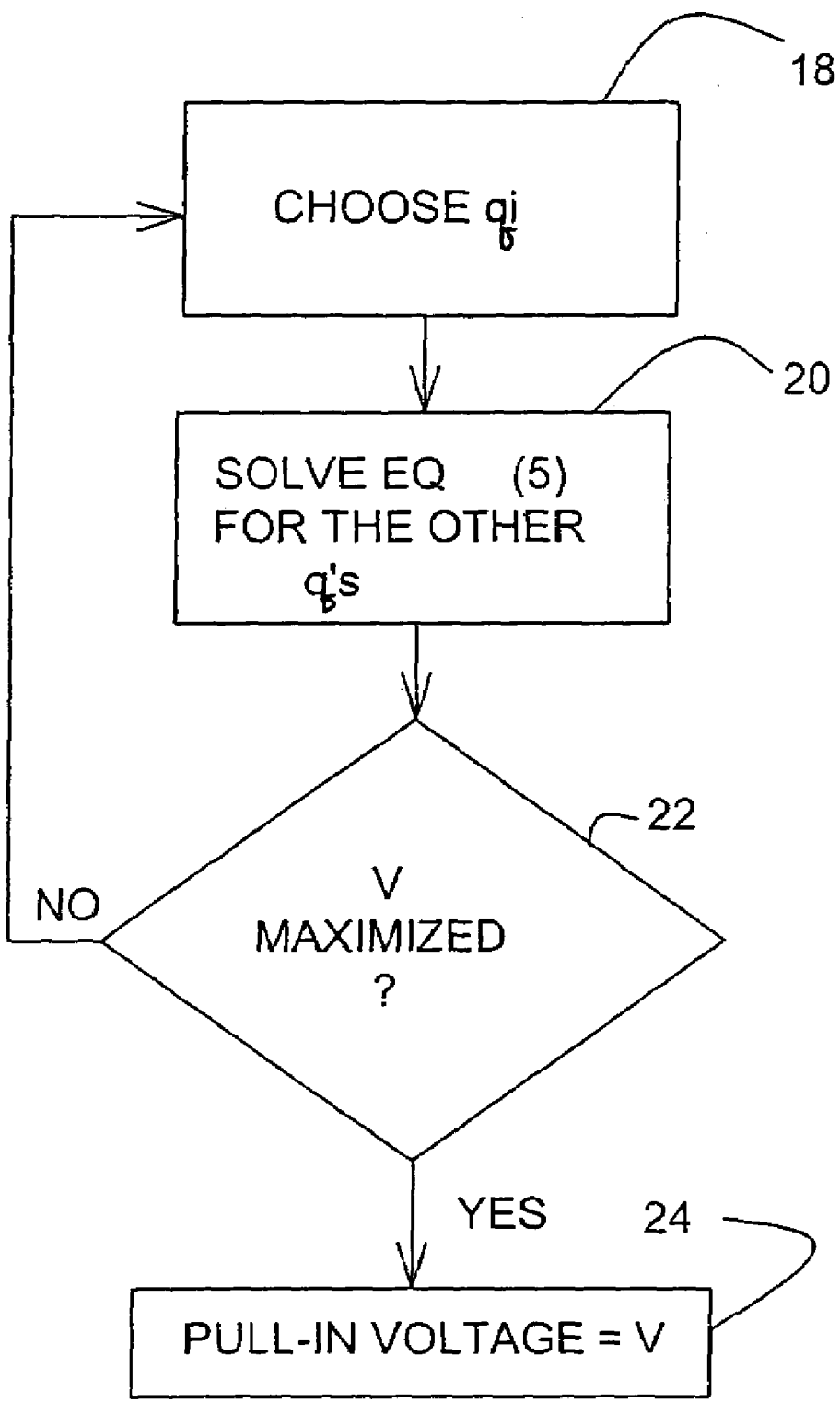
FIG. 4 is a high level flow chart of the overall method of the present invention.

FIG. 4 is a flow chart of the method of the present invention. At each iteration, in block 18, one electrostatic degree of freedom, denoted by i, $1 \leq i \leq K$, is chosen for the displacement coordinate $q_i$ of that degree of freedom to be assigned a preselected value. In block 20, equations (5) are solved for the corresponding values of the other displacement coordinates $q_1$ through $q_{i-1}$ and $q_{i+1}$ through $q_N$. Equation (4) then gives the corresponding total applied voltage V. In block 22, it is determined whether the most recently calculated V is the maximal V, to within a predefined accuracy of the pull-in displacement. If the most recently calculated V is in fact the maximal V, then the most recently calculated V is the pull-in voltage (block 24). Otherwise, $q_i$ is assigned a new preselected value in block 18. Preferably, i is the same in all iterations. In iterations subsequent to the first iteration, the new value of $q_i$ is preselected according to the results of the most recent few iterations, as is known in the art of numerical optimization.

The iterative solution of equations (5) in block 20 can be carried out using a variety of solution schemes.

Figure 5:
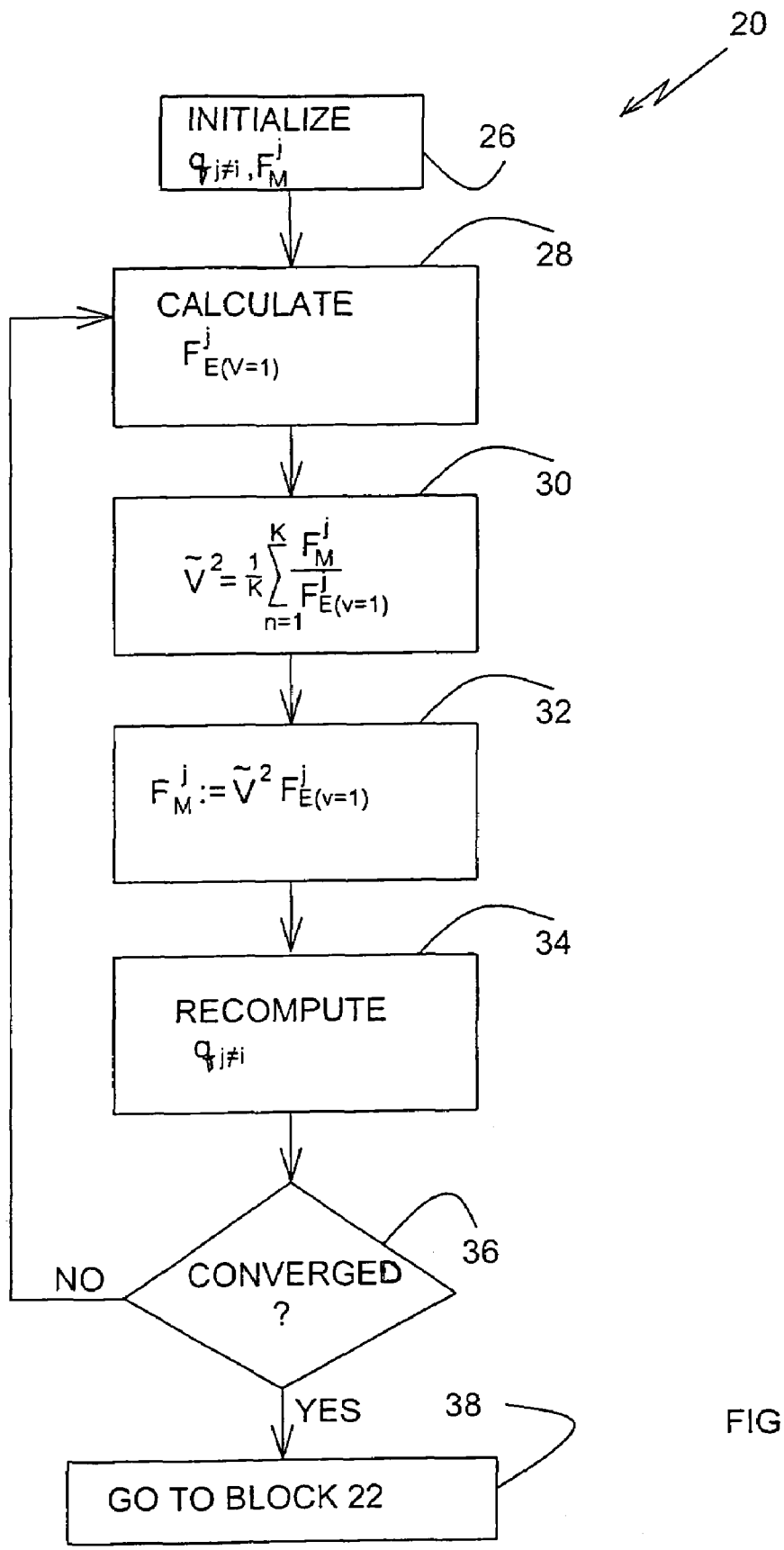
FIG. 5 is a detailed flow chart of the inner loop (block 20) of FIG. 4.

FIG. 5 is a flow chart of block 20 for a relaxation scheme for solving equations (5). In block 26, the displacement coordinates $q_j$ other than $q_i$ are assigned initial values, as described below, and a standard mechanical solver (see, for example, P. M. Osterberg, *Electrostatically Actuated Microelectromechanical Test Structures for Material Property Measurements*, PhD Thesis, Massachusetts Institute of Technology, September 1995) is used to compute the corresponding mechanical forces $F_M^J$. In block 28, a standard electrostatic solver (for example, CoventorWare, available from Coventor, Inc. of Cary N.C. USA) is used to compute the unit-voltage electrostatic forces $F_{E(V=1)}^J$. In block 30, equation (4) gives the current estimate of $\bar{V}^2$. In block 32, the mechanical forces, that depend on the K degrees of freedom associated with the electrostatic energy of actuator 10, are updated. In block 34, the mechanical solver recomputes the displacement coordinates $q_1$, other than $q_i$ on the basis of the new mechanical forces. If the computation of the $q_j$ has converged (block 36), the algorithm goes to block 22 (block 38). Otherwise, the latest values of the $q_j$ and the $F_M^J$ are again used to calculate the $F_{E(V=1)}^J$ in block 28.

In the first iteration of the overall algorithm, in block 26, the initial deformation is chosen as the elastic solution of the mechanical problem with $q_i$ as fixed for the first iteration and with no electrostatic forces applied. In subsequent iterations of the overall algorithm, the values of $q_{j \neq i}$ selected in block 26 are proportional to their final values in the previous iteration, with the proportionality constant being the ratio between the present fixed value of $q_1$ and the immediately preceding fixed value of $q_i$.

Alternatively, equations (5) are solved using a gradient scheme, for example using the standard Newton method. For this purpose, the gradients of the left hand side of equation (5a) are needed. These gradients are $$g_{jk} = \frac{\frac{\partial F_M^j}{\partial q_k} F_{E(V=1)}^j - F_M^j \frac{\partial F_{E(V=1)}^j}{\partial q_k}}{(F_{E(V=1)}^j)^2} - \frac{1}{K}\sum_{n=1}^{K} \frac{\frac{\partial F_M^n}{\partial q_k} F_{E(V=1)}^n - F_M^n \frac{\partial F_{E(V=1)}^n}{\partial q_k}}{(F_{E(V=1)}^n)^2} \quad (6)$$

where $1 \leq j \leq K$, $j \neq i$, and $k \leq 1 \leq N$, $k \neq i$. The mechanical forces $F_M^j$ and their gradients $$\frac{\partial F_M^j}{\partial q_k}$$

are computed using a standard mechanical solver. The unit voltage electrostatic forces $$F^j_{E(V=1)}$$

and their gradients $$\frac{\partial F^j_{E(V=1)}}{\partial q_k}$$

are computed using a standard electrostatic solver. The initial deformation in each iteration is computed as in the relaxation scheme.

The advantage of the relaxation scheme over the gradient scheme is that the relaxation scheme requires only separate electrostatic and mechanical field solvers and does not require the calculation of electromechanical coupled force gradients. Therefore, the relaxation scheme can be easily implemented in existing MEMS CAD tools with separate field solvers.

Figure 6:
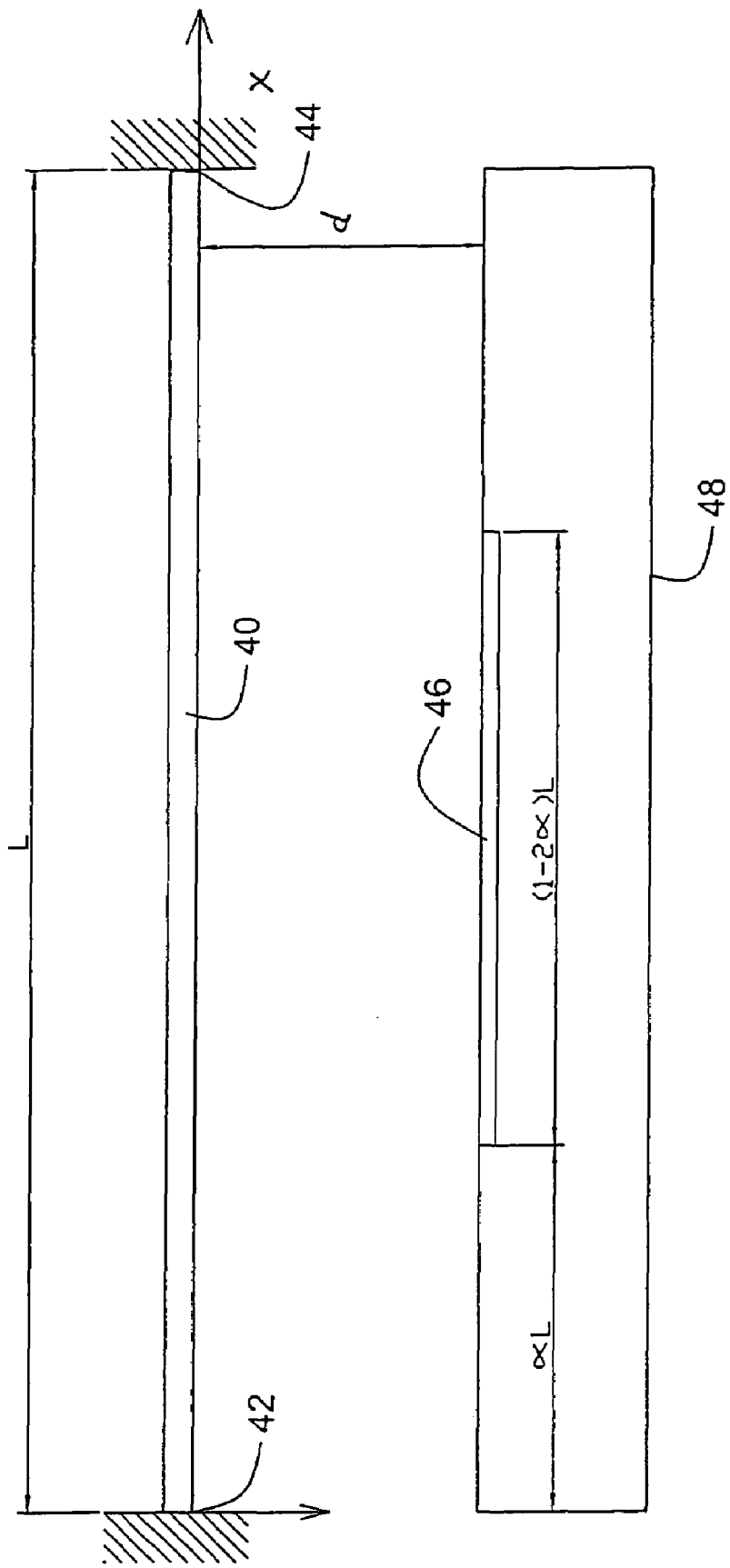
FIG. 6 shows the geometry of the clamped-clamped beam problem.

To demonstrate the capabilities of the present invention, the canonical problem of the clamped-clamped beam is chosen. The geometry of the problem is shown in FIG. 6. A grounded conducting elastic beam 40 is clamped at its ends 42 and 44 parallel to a substrate 48 that bears a counter electrode 46. To generalize the problem and to illustrate a case K<N, electrode 46 is limited to a portion of beam 40 $\alpha L<x<(1-\alpha)L$, where L is the length of beam 40 and $\alpha<0.5$. The equilibrium equations of elastic beam 40 are:

$$E^*I\frac{d^4y}{dx^4} - \sigma_r A\frac{d^2y}{dx^2} - \left[\frac{AE^*}{L}\int_0^L \frac{1}{2}\left(\frac{dy}{dx}\right)^2 dx\right]\frac{d^2y}{dx^2} = \tag{7}$$

$$\begin{cases} \frac{\varepsilon_0 W}{2(d-y)^2}\left(1+\frac{2}{\pi W}(d-y)\right)V^2 & \alpha L < x < (1-\alpha)L \\ 0 & 0 < x < \alpha L \\ 0 & (1-\alpha)L < x < L \end{cases}$$

where the effective elastic modulus, E*, is equal to Young's modulus E if the thickness of beam 40 is of the order of the width of beam 40, and is equal to the plate modulus $E/(1-v^2)$ if beam 40 is much wider than its thickness. Also, I is the second moment of the beam cross-section, A is the cross-section area, $\sigma_r$ is the effective residual stress, $\epsilon_0$ is the permittivity of free-space, d the initial gap between beam 40 and electrode 46, W is the width of beam 40 and {x, y} are Cartesian coordinates.

In equations (7) the first term on the left hand side is the mechanical bending force, the second term is the mechanical force due to residual stress and the third term is the mechanical force due to stress stiffening. The electrostatic force on the right hand side of equations (7) includes the fringing field effect (see R. S. Elliot, *Electromagnetics*, IEEE Press, New York 1993).

Equations (7) can be presented in the following normalized form:

$$\frac{d^4\tilde{y}}{d\tilde{x}^4} - 12\frac{\sigma_r}{E}\left(\frac{L}{t}\right)^2\frac{d^2\tilde{y}}{d\tilde{x}^2} - 6\frac{d^2}{t^2}\left[\int_0^1\left(\frac{d\tilde{y}}{d\tilde{x}}\right)^2 d\tilde{x}\right]\frac{d^2\tilde{y}}{d\tilde{x}^2} = \tag{8}$$

$$\begin{cases} \frac{1}{(1-\tilde{y})^2}\left(1+\frac{2d}{\pi W}(1-\tilde{y})\right)\tilde{V}^2 & \alpha < \tilde{x} < (1-\alpha) \\ 0 & 0 < \tilde{x} < \alpha \\ 0 & (1-\alpha) < \tilde{x} < 1 \end{cases}$$

where $\tilde{y} = \frac{y}{d}, \tilde{x} = \frac{x}{L}$ and $\tilde{V}^2 = \frac{\varepsilon_0 W L^4}{2d^3 E^* I}V^2$.

Equations (8) were iteratively solved using finite-differences in the prior art VI scheme and the scheme of the present invention. In each of the pull-in search points in the scheme of the present invention, the elastic deflection was iteratively solved using the relaxation method described above. In the prior art VI scheme the elastic deflection was solved using the relaxation method of Osterberg et al.

Figure 7:
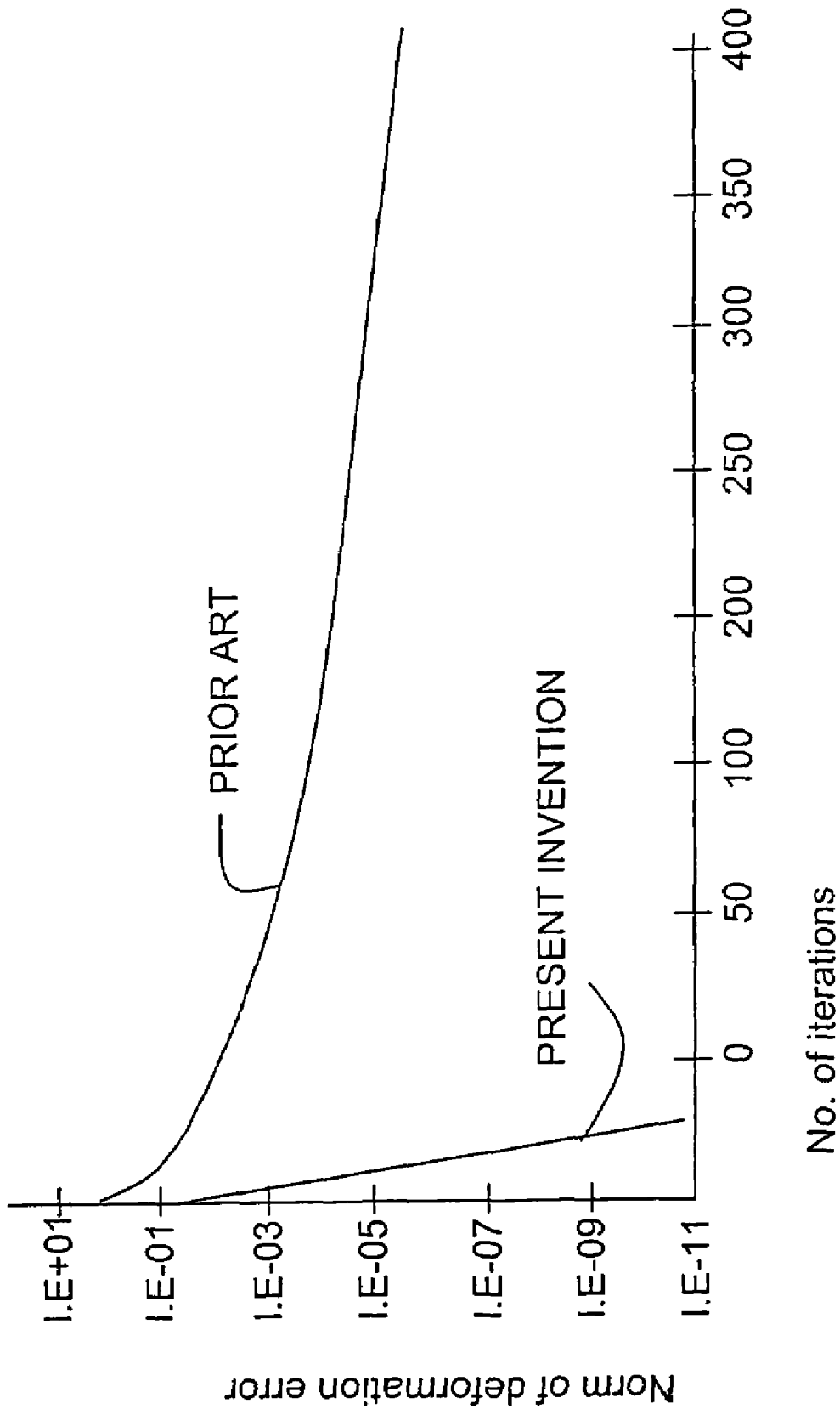
FIG. 7 shows a comparison of the convergence of the method of the present invention vs. the prior art method for the problem of FIG. 6.

In the present example, $\alpha=0.25$, $\sigma_r=0$, W>>d and t>>d. The convergence of the elastic deflection in both schemes is illustrated in FIG. 7. A voltage point was chosen for running the VI relaxation scheme. The norm of the relative error of the deflection was calculated at each of the iterations and is shown in FIG. 7. The resulting displacement at the center of the beam was used for running the relaxation scheme of the present invention. The norm of the relative error of the deflection is presented in logarithmic scale against the number of iterations. It is seen that the convergence of the scheme of the present invention is much faster than the convergence of the prior art VI scheme. Moreover, the convergence rate in the scheme of the present invention is constant, whereas the convergence rate in the prior art VI scheme varies and declines with each iteration. One consequence of this is that the convergence of the scheme of the present invention can be further improved using numerical acceleration methods (see G. D. Smith, *Numerical Solution of Partial Differential Equations: Finite Difference Methods*, Clarendon Press, Oxford, 3rd Edition 1993). In contrast, because the convergence of the VI scheme is not constant, it cannot be as easily accelerated.

Figure 2:
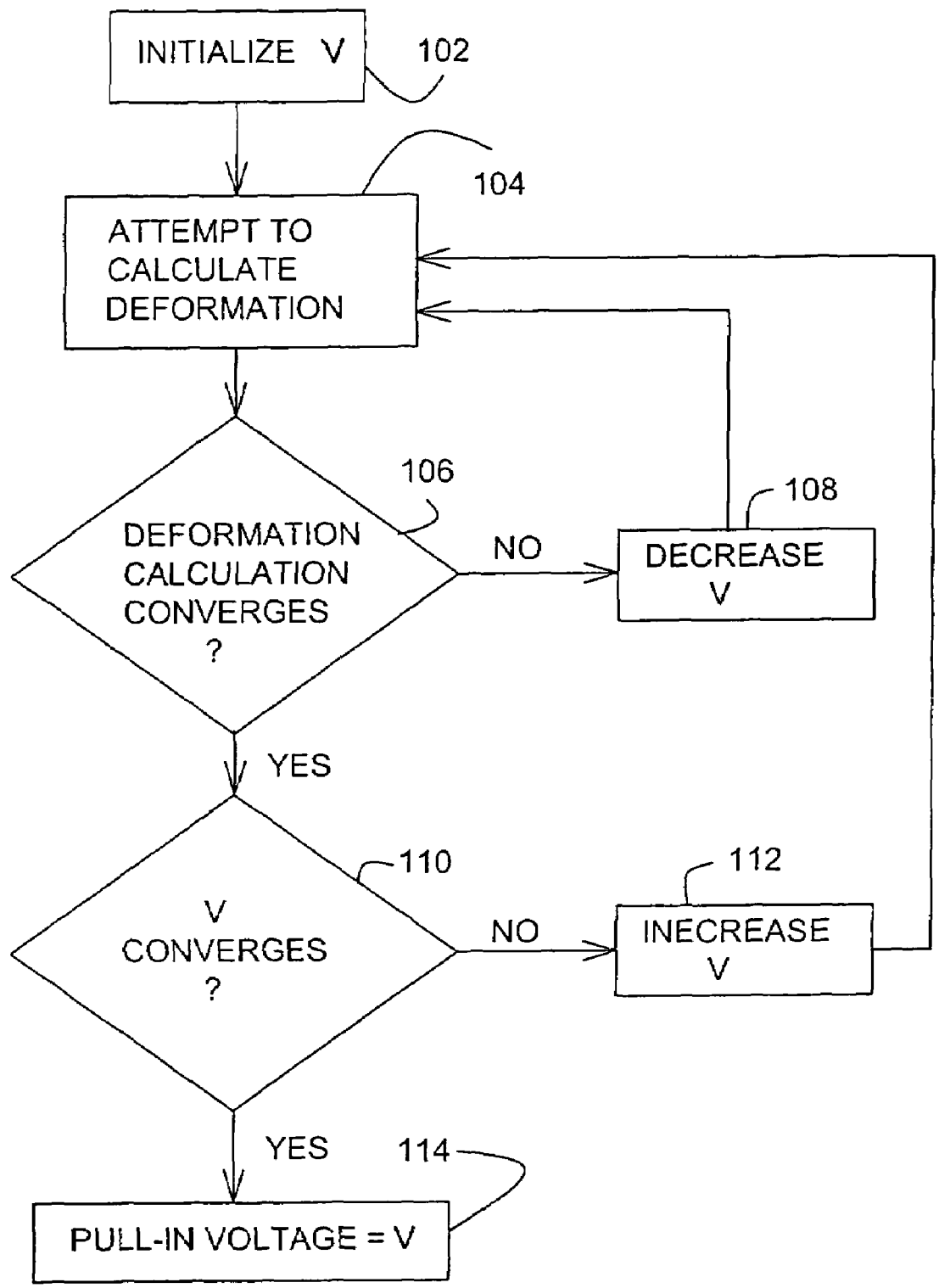
FIG. 2 is a high level flow chart of the prior art VI algorithm.
Figure 8:
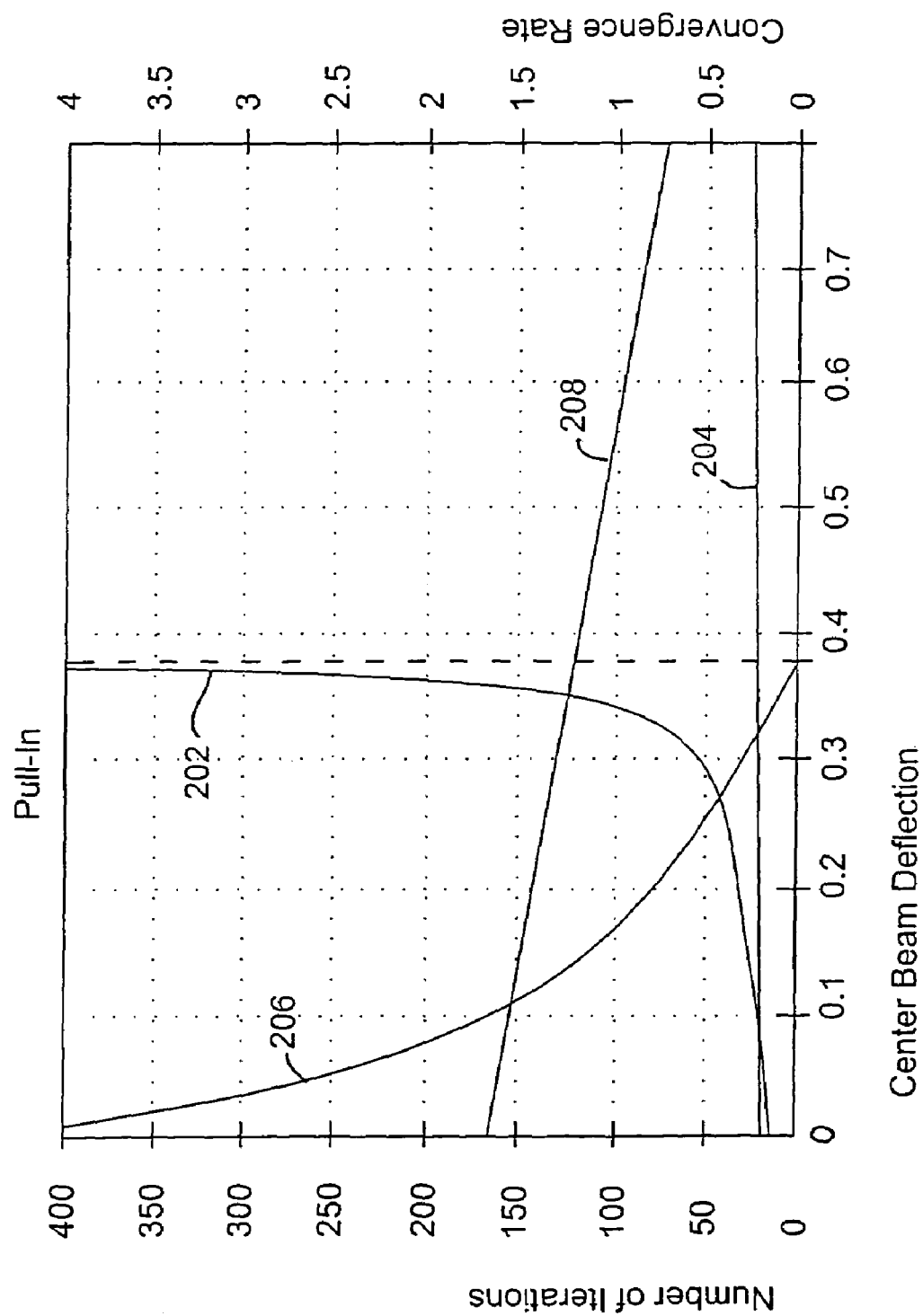
FIG. 8 is a combined plot of the numbers of inner loop iterations required by the method of the present invention vs. the prior art method in solving the problem of FIG. 6, and of the convergence rates of the method of the present invention vs. the prior art method in solving the problem of FIG. 6.

The reason for the superiority of the present invention over the prior art algorithm, as illustrated in FIG. 7, can be understood with reference to FIG. 8. Recall that in the inner loop over deformations in the prior art algorithm (block 104 of FIG. 2), the criterion for the applied voltage V being higher or lower than the pull-in voltage is whether the calculation of the corresponding deformation converges. The closer V gets to the pull-in voltage from below, the longer this convergence takes. By contrast, in the present invention, the convergence rate of the inner loop over unconstrained degrees of freedom (block 20 of FIG. 4) is not directly related to how close the current value of the applied voltage V is to the pull-in voltage.

The total number of iterations required to converge, at different deflections of the beam center point, is plotted in FIG. 8 as curve 202 for the prior art VI scheme and as curve 204 for the scheme of the present invention, with reference to the ordinate scale on the left side of FIG. 8. The corresponding convergence rates are plotted in FIG. 8, as curve 206 for the prior art VI scheme and as curve 208 for the scheme of the present invention, with reference to the ordinate on the right side of FIG. 8. The relative error, eu, described in FIG. 7, is approximated by log(eu)=a−ib, where a is a constant, b is the convergence rate and i is the iteration number. This approximation is motivated by the linear convergences (semi logarithmic scale in FIG. 7) of the scheme of the present invention. The convergence of the VI scheme tends to linearity after many iterations. It can clearly be seen that the convergence of the prior art VI scheme rapidly deteriorates as the pull-in point is approached, and that at the pull-in point the convergence vanishes. In contrast, the convergence rate of the scheme of the present invention is high and remains high even beyond the pull-in point.

Figure 9A:
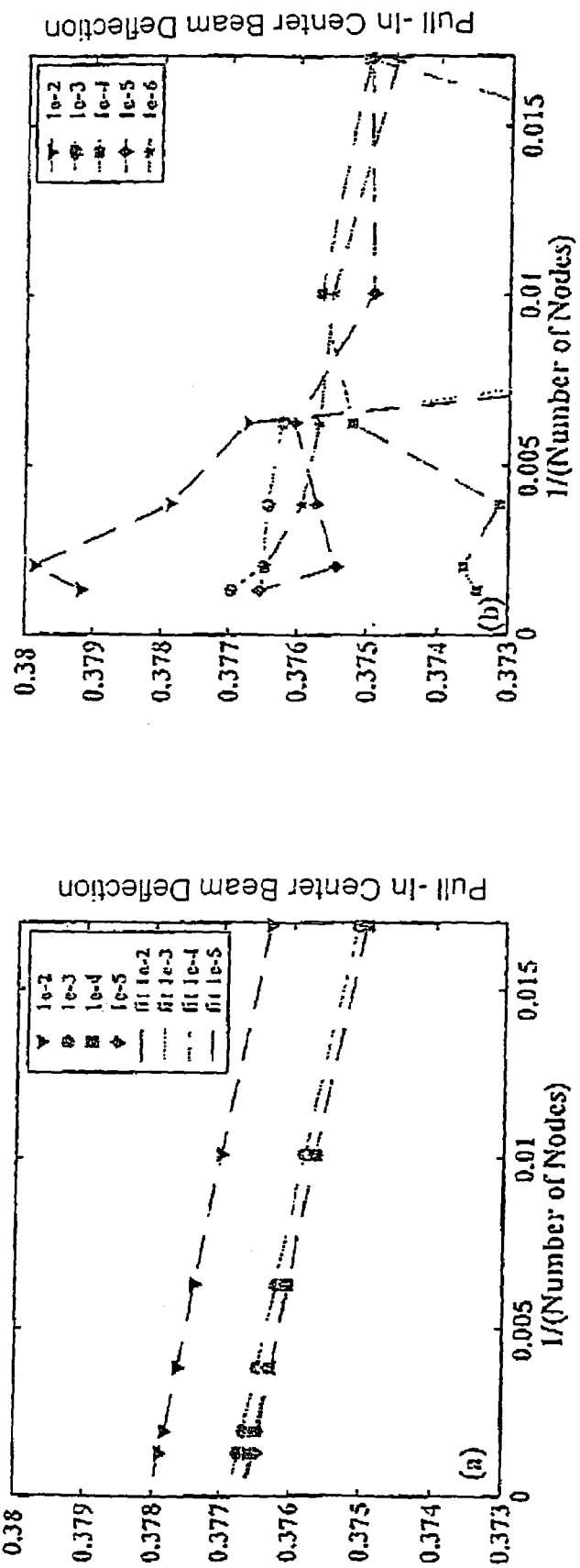
FIG. 9A shows the normalized pull-in center beam deflection, for the problem of FIG. 6, as computed by the method of the present invention and by the prior art method, for various numbers of nodes.
Figure 9B:
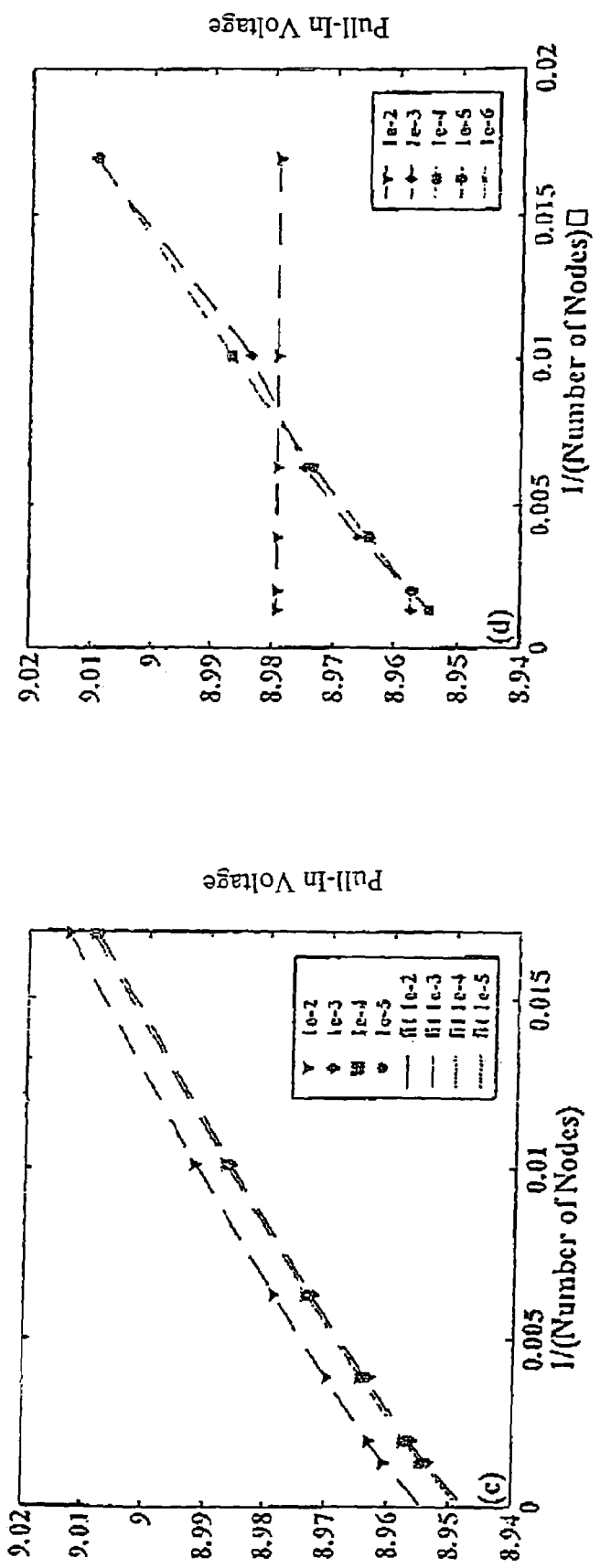
FIG. 9B shows the normalized pull-in voltage, for the problem of FIG. 6, as computed by the method of the present invention and by the prior art method, for various numbers of nodes.

In order to examine the consistency of both schemes, a specific problem (a specific value of $\alpha$) was solved using increasingly refined meshes for several convergence accuracies. To assure the convergence of the inner equilibrium loop (block 104 of FIG. 2; block 20 if FIG. 4), its accuracy (defined on the norm of the deflection errors) was set to two orders of magnitude higher than the required accuracy of the outer pull-in search loop. FIGS. 9A and 9B presents the normalized pull-in parameters calculated by both schemes against the inverse of the number of nodes. FIG. 9A refers to the normalized pull-in center beam deflection. FIG. 9B refers to the normalized pull-in voltage. For any given accuracy, the scheme of the present invention shows a similar consistent convergence as the mesh is refined, making it easy to predict a value at the limit of continuum. This predicted limit converges with increasing accuracy. In contrast, the prior art VI scheme shows an inconsistent behavior, which is less pronounced for the pull-in voltage at high accuracies. It is therefore concluded that it is impractical to extract a reliable estimation of the pull-in deflection using the prior art scheme. The voltage near the pull-in state is insensitive to the deflection errors and therefore for a sufficiently high accuracy, the prior art VI scheme yields reasonable estimations for the pull-in voltage.

Figure 10:
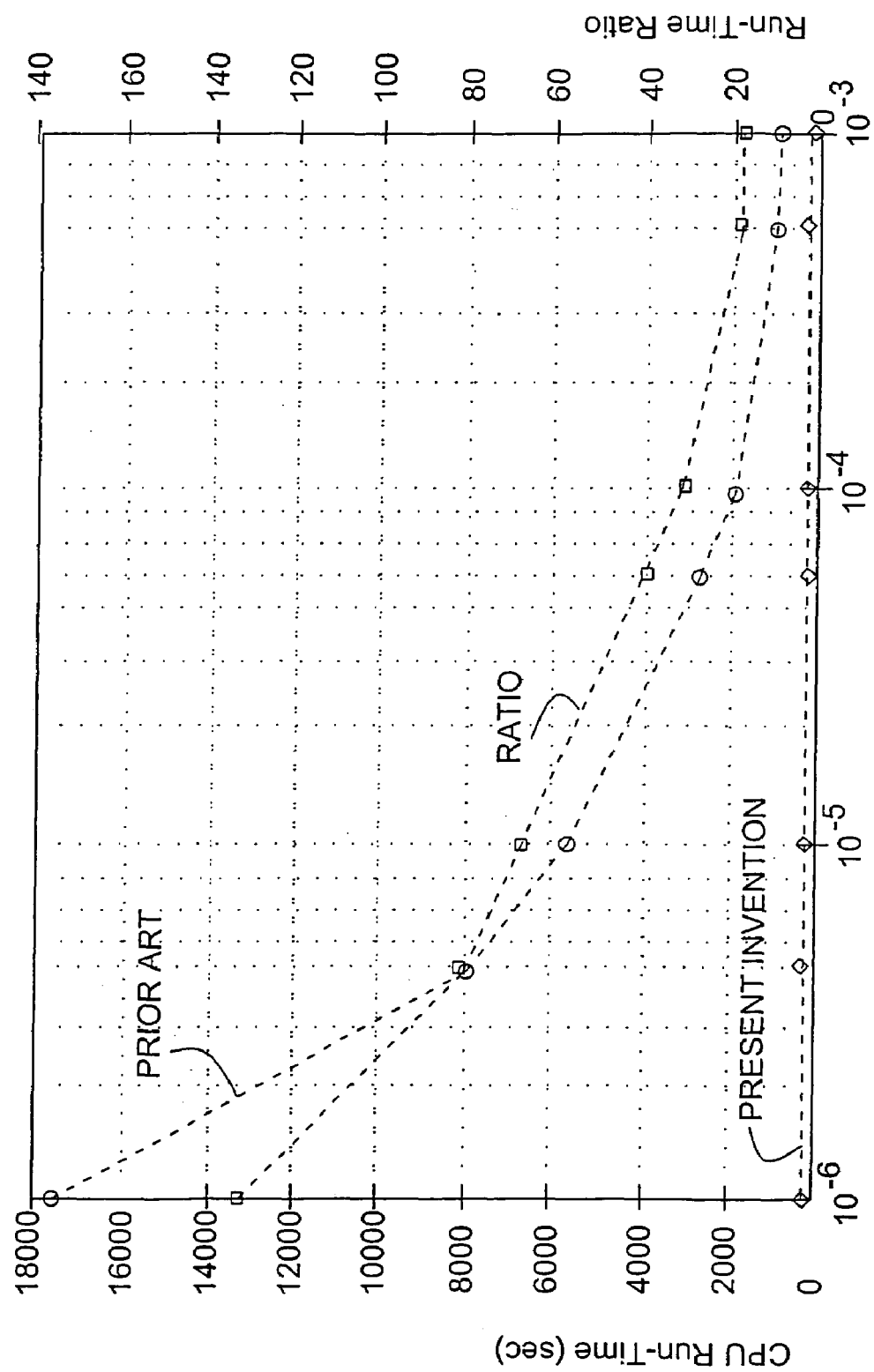
FIG. 10 shows run times, and run time ratios, for the method of the present invention vs. the prior art method.

FIG. 10 illustrates the difference in numerical effort required by each scheme to converge to the pull-in state within a given accuracy. The numerical effort is measured by the CPU runtime of an 800 MHz Pentium 3 processor required to approach the pull-in state. The ordinate on the left hand side of FIG. 10 is for the run times themselves (circles and diamonds). The ordinate on the right hand side of FIG. 10 is for the squares, which indicate the ratio of the circles' ordinates to the diamonds' ordinates. The great advantage of the scheme of the present invention, in terms of runtime (20-120 times faster), is trivially seen in FIG. 10. In practice, due to the consistency of the scheme of the present invention, a lower accuracy and a coarser mesh are sufficient to extract a reliable estimation of the pull-in parameters. On the other hand, in the prior art VI scheme a higher accuracy and a finer mesh are required to reach a reliable estimation. Therefore, the advantage of the scheme of the present invention is even higher than appears from FIG. 10 (>100 times faster).

To demonstrate the capability of the scheme of the present invention to solve more general problems, including non-linear stress stiffening, one of the actuators modeled by E. S. Hung and S. D. Senturia in "Extending the travel range of analog-tuned electrostatic actuators", JMEMS vol. 8 no. 4 pp. 497-505 (December 1999) using the prior art method was modeled using the method of the present invention. The parameters of the specific actuator considered were L=500 [μm], t=1 [μm], g=6.25 [μm], $\alpha$=½. Hung and Senturia used a finite difference VI scheme to derive the pull-in parameters and found that $V_{PI}$=83 [V] and a center beam deflection of $y_{PI}$=4 [μm], while the parameters derived using the algorithm of the present invention were $V_{PI}$=83.23 [V] and a center beam deflection of $y_{PI}$=4.004 [μm]. This good agreement has been verified in other cases as well thus confirming the capability of the algorithm of the present invention to extract the pull-in parameters of stress-stiffened actuators.

While the invention has been described with respect to a limited number of embodiments, it will be appreciated that many variations, modifications and other applications of the invention may be made.

What is claimed is:

1. A method of designing and fabricating an electromechanical actuator, comprising the steps of:
   (a) modeling the actuator as an elastic element having a plurality of geometric degrees of freedom; and
   (b) for each of a plurality of deformations of said elastic element:
      (i) specifying said each deformation by postulating a fixed displacement of one of said degrees of freedom,
      (ii) calculating corresponding displacements of all other said degrees of freedom, and
      (iii) calculating an applied voltage that corresponds to said displacements;
   a largest said applied voltage then being a pull-in voltage of the actuator, and said deformation that corresponds to said largest applied voltage then being a pull-in deformation of the actuator;
   (c) modifying said elastic element until at least one of said pull-in voltage and said pull-in deformation is in accordance with design criteria of the electromechanical actuator; and
   (d) fabricating the electromechanical actuator in accordance with said modified elastic element.

2. The method of claim 1, wherein, for each said deformation, said one degree of freedom whose displacement is fixed is a degree of freedom whereon an electrostatic energy of the elastic element depends.

3. The method of claim 1, wherein a displacement of a same degree of freedom is fixed for all said deformations of the elastic element.

4. The method of claim 1, wherein, for each of said displacements of said one degree of freedom, said corresponding displacements and said applied voltage are calculated by solving a set of equilibrium equations defined by requiring that, for each said degree of freedom, a derivative with respect to said each degree of freedom of a total co-energy of the electromechanical actuator vanishes.

5. The method of claim 4, wherein said equilibrium equations are solved by a relaxation scheme.

6. The method of claim 4, wherein said equilibrium equations are solved by a gradient-based scheme.

7. The method of claim 1, further comprising the step of:
   (e) altering the actuator to minimize said pull-in voltage.

8. The method of claim 1, further comprising the step of:
   (e) altering the actuator to maximize said pull-in deformation.

9. A computer-readable medium having stored thereon instructions for designing and fabricating an electromechanical actuator, which instructions, when executed by a processor, cause the processor:
   (a) to model the actuator as an elastic element having a plurality of geometric degrees of freedom;
   (b) for each of a plurality of deformations of said elastic element:
      (i) to specify said each deformation by postulating a fixed displacement of one of said degrees of freedom:
      (ii) to calculate corresponding displacements of all other said degrees of freedom, and
      (iii) to calculate an applied voltage that corresponds to said displacements;

a largest said applied voltage then being a pull-in voltage of the actuator, and said deformation that corresponds to said largest applied voltage then being a pull-in deformation of the actuator; and (c) to modify said elastic element until at least one of said pull-in voltage and said pull-in deformation is in accordance with design criteria of the electromechanical actuator.

10. The computer-readable medium of claim 9, having stored thereon instructions of a microelectromechanical system computer-aided design tool in which are integrated said instructions for designing and fabricating an electromechanical actuator.

* * * * *

UNITED STATES PATENT AND TRADEMARK OFFICE
CERTIFICATE OF CORRECTION

| | |
|---|---|
| PATENT NO. | : 7,412,358 B2 |
| APPLICATION NO. | : 10/160404 |
| DATED | : August 12, 2008 |
| INVENTOR(S) | : Ofir Bochobza-Degani et al. |

It is certified that error appears in the above-identified patent and that said Letters Patent is hereby corrected as shown below:

Please add:

On Title page Item (63)

Related U.S. Application Data:
Provisional Patent Application No. 60/295,017, filed June 4, 2001

In the Specification, Page 1, Line 10,
Please insert the following paragraph
after the Title and before FIELD AND BACKGROUND OF THE INVENTION:
--This application claims priority from U.S. Provisional Patent Application No. 60/295,017 filed June 4, 2001, which is hereby incorporated by reference.--

Signed and Sealed this

Twenty-fourth Day of February, 2009

JOHN DOLL
*Acting Director of the United States Patent and Trademark Office*